United States Patent
Manning et al.

[19]

[11] Patent Number: 5,821,584
[45] Date of Patent: *Oct. 13, 1998

[54] THIN FILM TRANSISTORS COMPRISING DRAIN OFFSET REGIONS

[75] Inventors: Monte Manning; Shubneesh Batra, both of Boise, Id.

[73] Assignee: Micron Technology, Inc., Boise, Id.

[ * ] Notice: The term of this patent shall not extend beyond the expiration date of Pat. No. 5,659,183.

[21] Appl. No.: 883,756

[22] Filed: Jun. 27, 1997

Related U.S. Application Data

[60] Continuation of Ser. No. 740,756, Nov. 1, 1996, Pat. No. 5,659,183, which is a division of Ser. No. 568,390, Dec. 6, 1995, Pat. No. 5,670,399.

[51] Int. Cl.$^6$ .................................................. H01L 29/78
[52] U.S. Cl. ........................................ 257/345; 257/607
[58] Field of Search ............................. 257/66, 345–348, 257/607

[56] References Cited

U.S. PATENT DOCUMENTS

| | | | |
|---|---|---|---|
| 4,318,216 | 3/1982 | Hsu | 29/571 |
| 5,021,845 | 6/1991 | Hashimoto | 357/23.4 |
| 5,104,818 | 4/1992 | Silver | 437/41 |
| 5,124,769 | 6/1992 | Tanaka et al. | 357/23.14 |
| 5,348,897 | 9/1994 | Yen | 437/40 |
| 5,396,099 | 3/1995 | Kitajima | 257/347 |
| 5,422,505 | 6/1995 | Shirai | 257/327 |
| 5,434,093 | 7/1995 | Chau et al. | 437/41 |
| 5,510,278 | 4/1996 | Nguyen et al. | 437/40 |
| 5,656,844 | 8/1997 | Klein et al. | 257/66 |

FOREIGN PATENT DOCUMENTS

| | | | |
|---|---|---|---|
| 1-089464 | 4/1989 | Japan | 257/347 |
| 1-158775A | 6/1989 | Japan . | |
| 4-254335A | 9/1992 | Japan . | |

OTHER PUBLICATIONS

Furuta, Hiroshi et al. "Hot–Carrier Induced Ion–Ioff Improvement Of Offset PMOS TFT", NEC Corporation, 1991, pp. 27–28.

Ohkubo, H. et al., "16 Mbit SRAM Cell Technologies for 2.0V Operation", IEDM, 1991, pp. 481–484.

Wolf, S., "Silicon Processing For The VLSI Era —vol. 2:Process Integration", ©1990 Lattice Press, pp. 66–69.

*Primary Examiner*—David B. Hardy
*Attorney, Agent, or Firm*—Wells, St. John, Roberts, Gregory & Matkin, P.S.

[57] ABSTRACT

A method of forming a thin film transistor of a first conductivity type includes, a) providing a thin film transistor layer of semiconductive material; b) first masking the thin film transistor layer to mask a desired drain offset region while leaving a desired channel region exposed; c) with the first masking in place, doping the exposed channel region with a conductivity enhancing impurity of a second type; d) second masking the thin film transistor layer to mask the channel region and the drain offset region and leave desired opposing source/drain regions exposed; and e) with the second masking in place, doping the exposed source/drain regions with a conductivity enhancing impurity of the first type. A thin film transistor includes, ii) a thin film layer of semiconductive material, the thin film layer comprising a source region, a drain region, a drain offset region and a channel region; the source and drain regions being conductively doped with a conductivity enhancing impurity of the first type to a concentration effective to render such source and drain regions electrically conductive; the channel region being doped with a conductivity enhancing impurity of a second type to a first concentration; the drain offset region being doped with a conductivity enhancing impurity of the second type to a second concentration, the second concentration being less than the first concentration; and ii) a gate positioned operatively adjacent the channel region. Alternately, the drain offset region consists essentially of undoped semiconductive material.

8 Claims, 4 Drawing Sheets

1

THIN FILM TRANSISTORS COMPRISING DRAIN OFFSET REGIONS

RELATED PATENT DATA

The present application is a continuation application of U.S. patent application Ser. No. 08/740,756, filed Nov. 1, 1996, now U.S. Pat. No. 5,659,183, which is a divisional application of U.S. patent application Ser. No. 08/568,390 which was filed on Dec. 6, 1995, now U.S. Pat. No. 5,570,399.

PATENT RIGHTS STATEMENT

This invention was made with Government support under Contract No. MDA972-92-C-0054 awarded by Advanced Research Projects Agency (ARPA). The Government has certain rights in this invention.

TECHNICAL FIELD

This invention relates to thin film transistors and methods of forming thin film transistors.

BACKGROUND OF THE INVENTION

As circuit density continues to increase, there is a corresponding drive to produce smaller and smaller field effect transistors. Field effect transistors have typically been formed by providing active areas within a bulk substrate material or within a complementary conductivity type well formed within a bulk substrate. One additional technique finding greater application in achieving reduced transistor size is to form field effect transistors with thin films, which is commonly referred to as "thin film transistor" (TFT) technology. These transistors are formed using thin layers which constitute all or a part of the resultant source and drain regions.

Specifically, typical prior art TFT's are formed from a thin film of semiconductive material (typically polysilicon). A central channel region of the thin film is masked by a separate layer, while opposing adjacent source/drain regions are doped with an appropriate p or n type conductivity enhancing impurity. A gate insulator and gate are provided either above or below the thin film channel region, thus providing a field effect transistor having active and channel regions formed within a thin film as opposed to a bulk substrate.

Literature reports have shown that it is possible to enhance the performance of thin film transistors, and particularly polysilicon thin film transistors, by using a drain offset between the channel region and the drain region. The prior art literature reports provision of such layer to have a doping concentration identical to that of the channel region, or more preferably to have a dopant concentration of opposite conductivity type to that of the channel region and at a concentration less than that of the heavily conductively doped source and drain regions.

Utilization of drain offset regions in thin film transistors is particularly advantageous in static random access memory cell constructions. Typical resistor load SRAM cells are not suitable for high density SRAMs as they do not provide desired low leakage, cell stability or alpha-particle immunity. Six transistor stacked CMOS SRAM cells with polysilicon thin film transistor loads can provide required low leakage while providing high ON currents at the same time which makes the cell more stable. Such transistors are more suitable for 16 megabyte or higher density SRAMs. The drain offset region in such transistors reduces the electric field near the drain which reduces the leakage, and at the same time does not reduce the drive current significantly resulting in a high ON/OFF ratio.

Attributes of the invention will be more readily appreciated by an initial description of two prior art processes for producing thin film transistors having drain offsets. For example, FIG. 1 illustrates a semiconductor wafer fragment 10 comprised of a substrate 12. An insulating layer 13 is provided thereover, and includes an intervening or embedded electrically conductive transistor gate 14. That portion of substrate 12 immediately beneath layer 13 and gate 14 would comprise an insulator material. A gate dielectric layer 16 overlies insulating layer 13 and gate 14. Further, a thin film transistor layer 18 is provided over gate dielectric layer 16.

In accordance with prior art methods, thin film transistor layer 18 is subjected to a blanket implant, in this described example an n-type material, to some suitable first low concentration, such as $5\times10^{17}$ ions/cm$^3$–$1\times10^{18}$ ions/cm$^3$. The function of the blanket implant is to provide desired resultant semiconductivity for the channel region of the transistor.

Referring to FIG. 2, a mask 19 is provided over thin film transistor layer 18 to define a desired n– channel region 20 overlying gate 14. Wafer 10 is then subjected to p-type doping to provide an example p– implant concentration outside of mask 19 to provide an example p– concentration of from $5\times10^{18}$ ions/cm$^3$–$5\times10^{19}$ ions/cm$^3$. The purpose of such implant is to overwhelm the concentration of the blanket n– implant previously provided to produce a desired drain offset region.

Referring to FIG. 3, channel region 20 and what becomes a desired drain offset region 24 are masked with a photoresist masking block 25. Wafer fragment 10 is then subjected to heavy p-type doping to provide a resultant p+ concentration of for example greater than or equal to $1\times10^{20}$ ions/cm$^3$. The result is provision of desired source and drain regions 26 and 27, respectively. The effect is to produce a lighter doped drain offset region of the same conductivity type of the source and drain regions.

An alternate prior art method of producing thin film transistors having drain offsets is described with reference to FIG. 4. Like numerals from the first described embodiment are utilized where appropriate, with differences being indicated by the suffix "a", or with different numerals. FIG. 4 in this described embodiment depicts a processing step immediately subsequent to the FIG. 1 processing step of the first described embodiment. Here, a masking block 19a is patterned to overlap or extend laterally beyond the confines of gate 14 to provide a source offset region 17 and a drain offset region 24a. The wafer is then subjected to heavy p+ doping to produce the illustrated source and drain regions 26a and 27a, respectively. Therefore in accordance with this described prior art embodiment, the resultant drain offset region 24a is provided to be of the same identical concentration and conductivity type as that of channel region 22.

Yet another alternate prior art embodiment and method are shown in FIGS. 5 and 6. Like numerals from the first described embodiment are utilized where appropriate, with differences being indicated by the suffix "b" or with different numerals. FIG. 5 illustrates a wafer fragment 10b shown at a processing step immediately subsequent to that depicted by FIG. 1 of the first described embodiment. Here, a photoresist masking layer 19b is patterned to provide an opening 21 effective for producing a desired drain offset region 24. The wafer fragment is then subjected to light p-type doping, yet to a concentration sufficient to overwhelm the n− concentration previously provided in drain offset region 24 by the FIG. 1 blanket implant.

Referring to FIG. 6, masking block 25 is provided and the wafer subjected to p+ doping to effectively produce the same resultant prior art construction of FIG. 3.

This invention concerns improved methods of forming thin film transistors having drain offsets as well as to an improved thin film transistor construction.

BRIEF DESCRIPTION OF THE DRAWINGS

Preferred embodiments of the invention are described below with reference to the following a accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a thin film transistor of a first conductivity type comprises the following steps:

providing a thin film transistor layer of semiconductive material;

first masking the thin film transistor layer to mask a desired drain offset region while leaving a desired channel region exposed;

with the first masking in place, doping the exposed channel region with a conductivity enhancing impurity;

second masking the thin film transistor layer to mask the channel region and the drain offset region and leave desired opposing source/drain regions exposed; and with the second masking in place, doping the exposed source/drain regions with a conductivity enhancing impurity of the first type.

In accordance with another aspect of the invention, a thin film transistor of a first conductivity type comprises:

a thin film layer of semiconductive material, the thin film layer comprising a source region, a drain region, a drain offset region and a channel region; the source and drain regions being conductively doped with a conductivity enhancing impurity of the first type to a concentration effective to render such source and drain regions electrically conductive; the channel region being doped with a conductivity enhancing impurity to a first concentration; the drain offset region being doped with a conductivity enhancing impurity of the second type to a second concentration, the second concentration being less than the first concentration; and a gate positioned operatively adjacent the channel region.

In accordance with still a further aspect of the invention, a thin film transistor of a first conductivity type comprises:

a thin film layer of semiconductive material, the thin film layer comprising a source region, a drain region, a drain offset region and a channel region; the source and drain regions being conductively doped with a conductivity enhancing impurity of the first type to a concentration effective to render such source and drain regions electrically conductive; the channel region being doped with a conductivity enhancing impurity; the drain offset region consisting essentially of undoped semiconductive material; and a gate positioned operatively adjacent the channel region.

Figure 1:
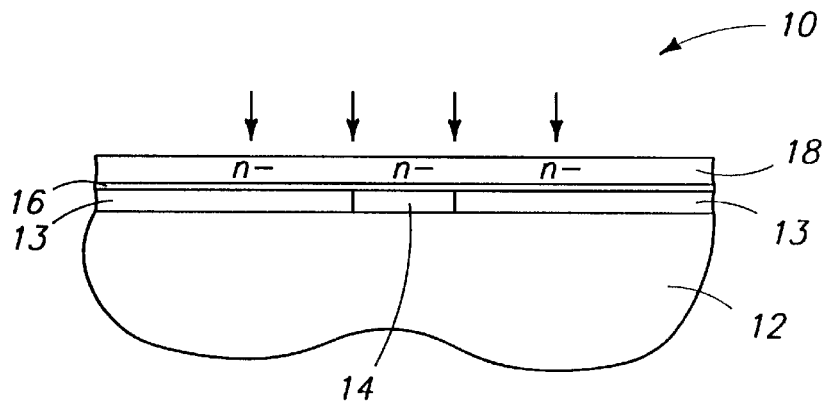
FIG. 1 is a diagrammatic sectional view of one prior art wafer fragment and is discussed in the "Background" section above.
Figure 2:
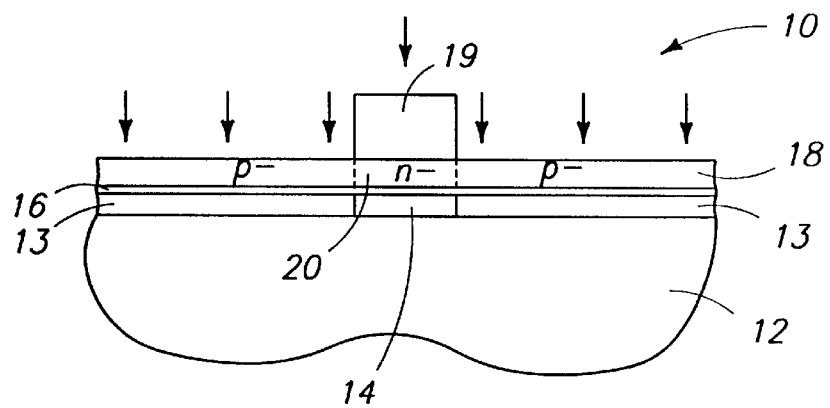
FIG. 2 is a view of the prior art FIG. 1 wafer at a prior art processing step subsequent to that shown by FIG. 1.
Figure 3:
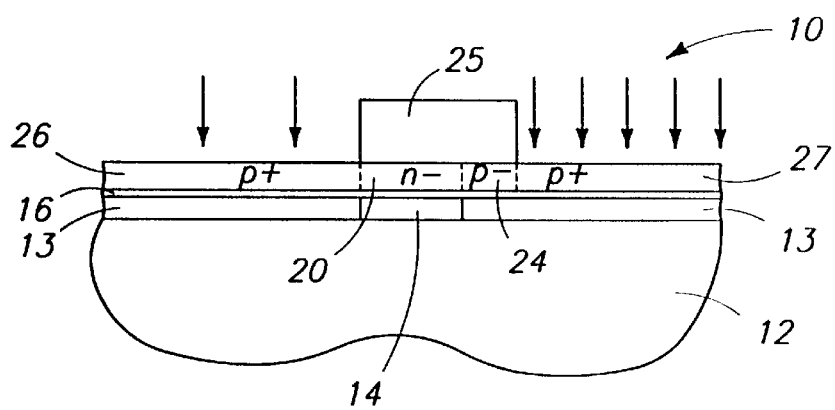
FIG. 3 is a view of the prior art FIG. 1 wafer at a prior art processing step subsequent to that shown by FIG. 2.
Figure 4:
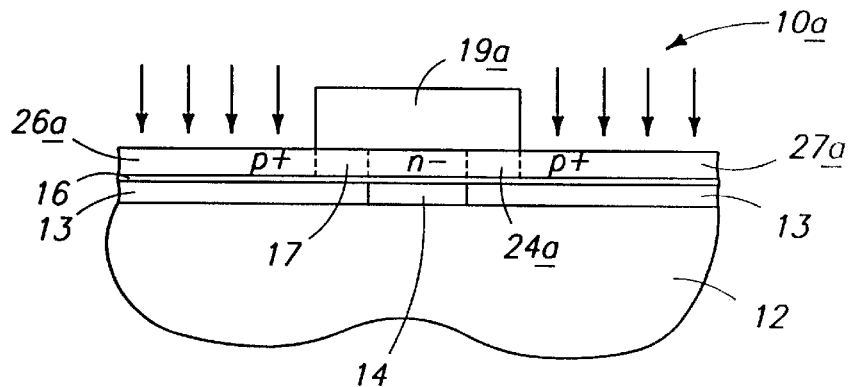
FIG. 4 is a diagrammatic sectional view of another prior art wafer fragment and is discussed in the "Background" section above.
Figure 5:
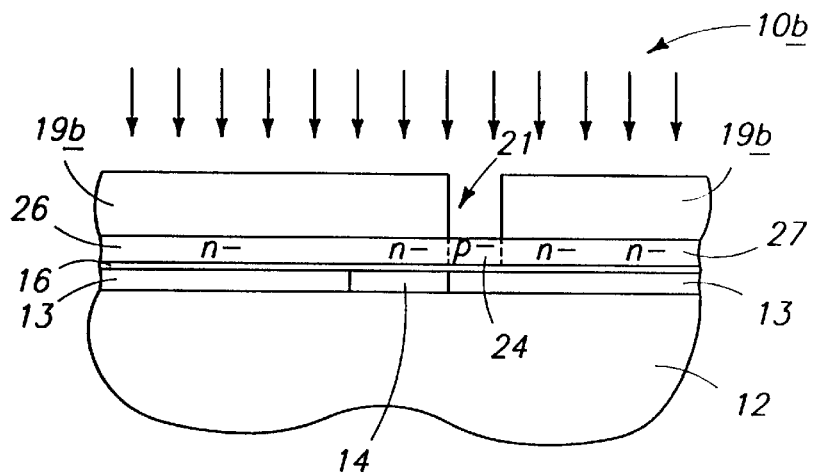
FIG. 5 is a diagrammatic sectional view of yet another prior art wafer fragment and is discussed in the "Background" section above.
Figure 6:
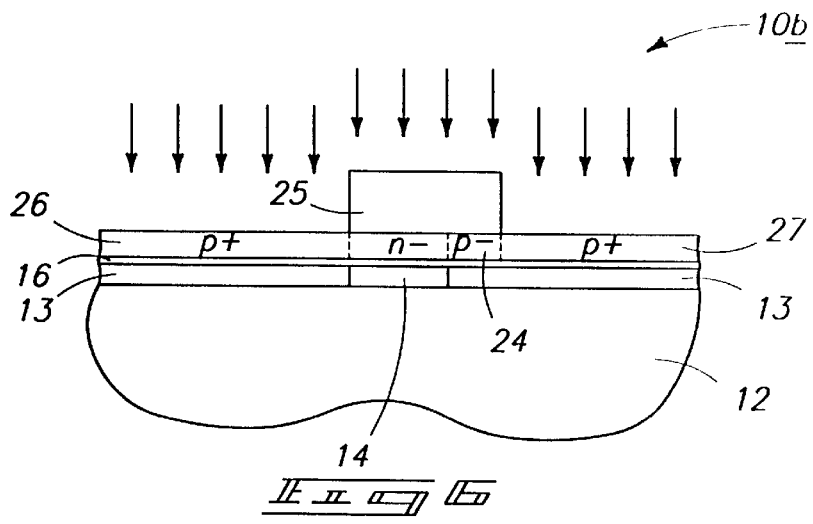
FIG. 6 is a view of the prior art FIG. 5 wafer at a prior art processing step subsequent to that shown by FIG. 5.
Figure 7:
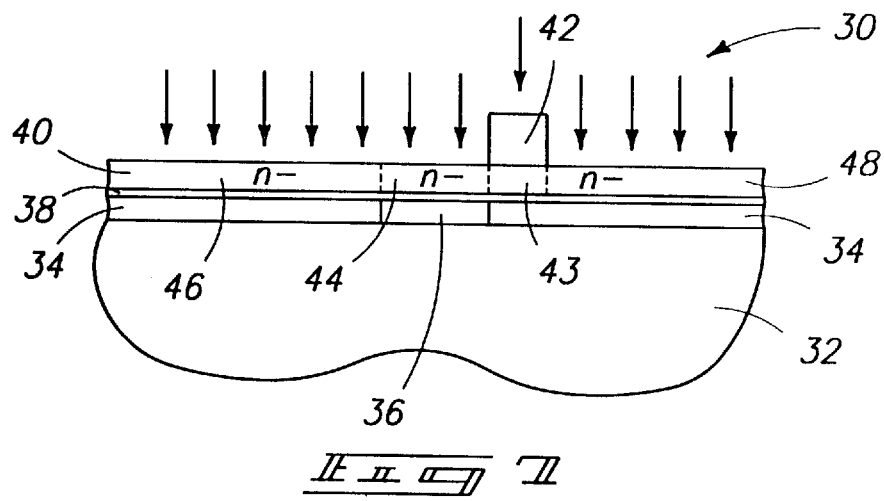
FIG. 7 is a diagrammatic sectional view of a wafer fragment at one processing step in accordance with the invention.
Figure 8:
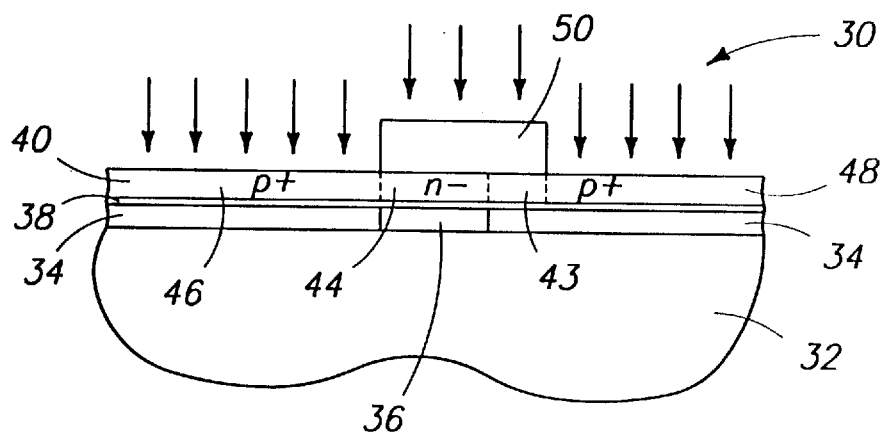
FIG. 8 is a view of the FIG. 7 wafer at a prior art processing step subsequent to that shown by FIG. 7.

The discussion first proceeds with reference to FIGS. 7 and 8 which illustrate the most preferred embodiment of the disclosure. FIG. 7 illustrates a wafer fragment 30 comprising a substrate 32, preferably as described above with respect to FIG. 1. An insulating layer 34 is provided outwardly of substrate 32, and includes an electrically conductive transistor gate 36 embedded therein. A thin film transistor dielectric layer 38 is provided outwardly of insulating layer 34 and gate 36. A thin film transistor layer 40 is provided outwardly of gate dielectric layer 38. The principal preferred material for layer 40 is undoped polycrystalline silicon as-deposited.

A first mask 42 is provided over thin film transistor layer 40 to mask a desired drain offset region 43 while leaving a desired channel region 44 and a desired source region 46 and desired drain region 48 exposed. Thin film transistor layer 40 is then doped, preferably by ion implantation, with a conductivity enhancing impurity of a second type. In this described embodiment, the preferred second type is "n". while the first conductivity type is "p". Such can be reversed, with the first conductivity type being "n" and the second conductivity type being "p". Alternately, the types might be the same. Regardless, an example concentration for the FIG. 7 implant is $5 \times 10^{17}$ ions/cm$^3$–$1 \times 10^{18}$ ions/cm$^3$ for forming a desired channel region 44 concentration. In this described example and in contradistinction to the prior art, thin film transistor layer 40 is provided to be void of any previous blanket doping which inherently provided the desired dopant concentration for a channel region. In this preferred embodiment, doping occurs, but with a mask 42 in place. Mask 42 could also be patterned to cover the source and drain regions, yet leave the channel region exposed.

Referring to FIG. 8, a second mask 50 is provided over thin film transistor layer 40 to mask channel region 44 and drain offset region 43 and leave opposing source region 46 and drain region 48 exposed. Thereafter, thin film transistor layer 40 is subjected to conductivity doping with a conductivity enhancing impurity of the first type to produce the illustrated p+ source and drain regions 46 and 48, respectively. Thus, the preferred and resultant thin film transistor construction includes a drain offset region which consists essentially of undoped semiconductive material of layer 40 as-deposited.

In accordance with this aspect of the invention, it has been discovered that transistors having intrinsic, undoped drain offset regions provide acceptable and improved performance over prior art constructions. The processing also provides the added advantage of eliminating the need for a separate drain offset implant. Yet, the invention is only limited by the accompanying claim appropriately interpreted in accordance with the doctrine of equivalents.

Figure 9:
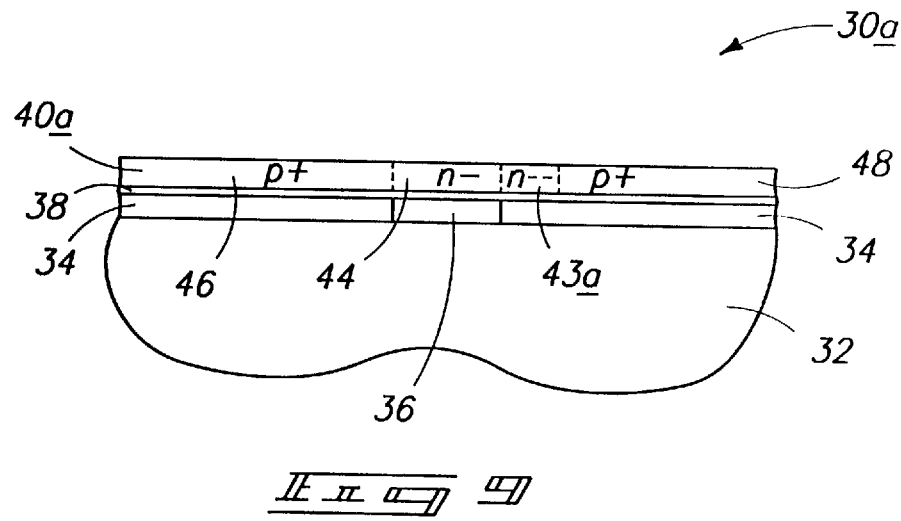
FIG. 9 is a diagrammatic sectional view of an alternate embodiment wafer fragment produced in accordance with the invention.

One alternate example is described with reference to FIG. 9. Like numerals from the FIGS. 7 and 8 embodiment are utilized where appropriate with differences being indicated by the suffix "a", or with different numerals. In this described embodiment, drain offset region 43a is subjected to second conductivity type doping. One example by which such doping might occur would be by a separate dedicated masking step, to produce the depicted n-- concentration. Alternately, thin film transistor layer 40a might be subjected to a blanket n-- conductivity doping prior to the processing sequence depicted by FIG. 7. Further alternatively, layer 40a might be effectively subjected to second conductivity type doping by being provided to be in situ conductively n-- doped during its deposition. Regardless, the dopant concentration for region 43a will be provided to be less than the dopant concentration for channel region 44. This is in contradistinction to the above prior art, where n-type conductivity drain offset regions are of the same identical concentration of the adjacent channel region.

Further alternately but less preferred, drain offset region 43a in accordance with the methodical aspects of the invention might be doped with a conductivity enhancing impurity of the first type to a concentration less than that of the resultant source and drain regions 46 and 48, respectively.

Figure 10:
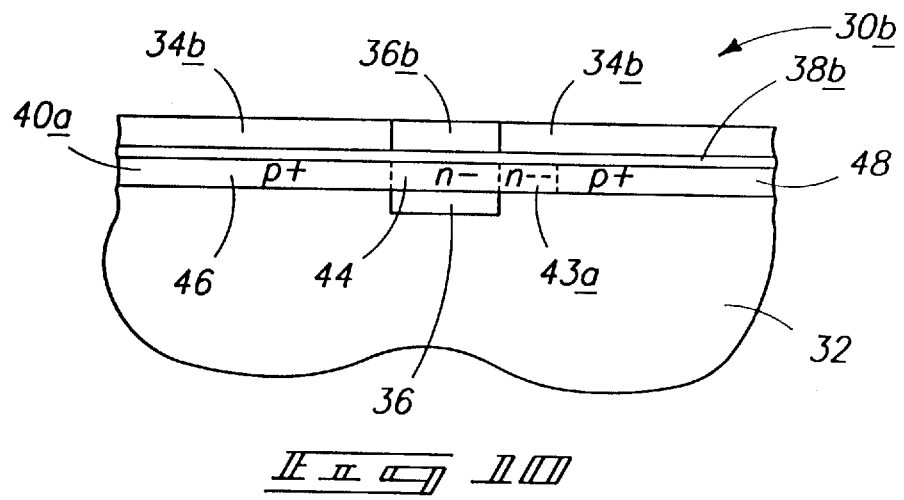
FIG. 10 is a diagrammatic sectional view of another alternate embodiment wafer fragment produced in accordance with the invention.

The above described embodiments depict a bottom gated thin film transistor construction. FIG. 10 illustrates an alternate embodiment wafer fragment 30b of a top gated construction. Like numerals from the first described embodiment are utilized where appropriate, with differences being indicated by the suffix "b". Further, the above described embodiments could also be arranged such that the offset regions are gated.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A thin film transistor of a first conductivity type comprising:
   a thin film layer of semiconductive material, the thin film layer comprising a source region, a drain region, a drain offset region and a channel region; the source region being in physical contact with the channel region, the source and drain regions being conductively doped with a conductivity enhancing impurity of the first conductivity type to a concentration effective to render such source and drain regions electrically conductive; the drain offset region being doped with a conductivity enhancing impurity of a second conductivity type to a concentration which is not identical to a concentration of dopant within the channel region.

2. The thin film transistor of claim 1 wherein the conductivity type of the channel region is the second type, the second type conductivity enhancing impurity of the channel region and the drain offset region being the same impurity.

3. The thin film transistor of claim 1 wherein the first conductivity type is p and the second conductivity type is n.

4. The thin film transistor of claim 1 wherein the first conductivity type is n and the second conductivity type is p.

5. A thin film transistor of a first conductivity type comprising:
   a thin film layer of semiconductive material, the thin film layer comprising a source region, a drain region, a drain offset region and a channel region; the source and drain regions being conductively doped with a conductivity enhancing impurity of the first conductivity type to a concentration effective to render such source and drain regions electrically conductive; the drain offset region being doped with a conductivity enhancing impurity of a second conductivity type to a concentration which is not identical to a concentration of dopant within the channel region;
   a gate positioned operatively adjacent the channel region; and
   the drain offset not being gated.

6. A thin film transistor of a first conductivity type comprising:
   a thin film layer of semiconductive material, the thin film layer comprising a drain offset region and a channel region; the drain offset region being doped with a conductivity enhancing impurity of a second conductivity type to a concentration which is not identical to a concentration of dopant within the channel region;
   a gate positioned operatively adjacent the channel region; and
   the drain offset not being gated.

7. A thin film transistor of a first conductivity type comprising:
   a thin film layer of polysilicon, the thin film layer comprising a source region, a drain region, a drain offset region and a channel region; the source and drain regions being conductively doped with a conductivity enhancing impurity of the first conductivity type to a concentration effective to render such source and drain regions electrically conductive; the channel region being doped with a conductivity enhancing impurity to a first concentration; the drain offset region being doped with a conductivity enhancing impurity of a second conductivity type to a second concentration, the second concentration being less than the first concentration; and
   a gate positioned operatively adjacent the channel region.

8. A thin film transistor of a first conductivity type comprising:
   a thin film layer of polysilicon, the thin film layer comprising a source region, a drain region, a drain offset region and a channel region the source region being in physical contact with the channel region; the source and drain regions being conductively doped with a conductivity enhancing impurity of the first conductivity type to a concentration effective to render such source and drain regions electrically conductive; the channel region being doped with a conductivity enhancing impurity to a first concentration; the drain offset region being doped with a conductivity enhancing impurity of a second conductivity type to a second concentration, the second concentration being less than the first concentration; and
   a gate positioned operatively adjacent the channel region.

* * * * *

UNITED STATES PATENT AND TRADEMARK OFFICE
CERTIFICATE OF CORRECTION

PATENT NO. : 5,821,584
DATED : October 13, 1998
INVENTOR(S) : Monte Manning; Shubneesh Batra It is certified that error appears in the above-identified patent and that said Letters Patent is hereby corrected as shown below:

Col. 1, l. 10: Replace "5,570,399" with --5,670,399--

Col. 2, l. 57: Replace "22" with --20--

Col. 6, l. 52: After "channel region" insert --,--.

Signed and Sealed this

Sixteenth Day of February, 1999

Attest:

Attesting Officer

Acting Commissioner of Patents and Trademarks